(12) United States Patent
Brunschwiler et al.

(10) Patent No.: US 8,363,402 B2
(45) Date of Patent: Jan. 29, 2013

(54) INTEGRATED CIRCUIT STACK

(75) Inventors: Thomas J. Brunschwiler, Thalwil (CH); Ryan J. Linderman, Pasadena, CA (US); Bruno Michel, Zurich (CH); Hugo E. Rothuizen, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 97 days.

(21) Appl. No.: 12/678,298

(22) PCT Filed: Sep. 17, 2008

(86) PCT No.: PCT/IB2008/053768
§ 371 (c)(1),
(2), (4) Date: Jul. 8, 2010

(87) PCT Pub. No.: WO2009/037648
PCT Pub. Date: Mar. 26, 2009

(65) Prior Publication Data
US 2010/0290188 A1    Nov. 18, 2010

(30) Foreign Application Priority Data

Sep. 17, 2007   (EP) .................................... 07116581

(51) Int. Cl.
*H05K 7/20* (2006.01)
(52) U.S. Cl. ........ 361/699; 361/698; 361/718; 361/719; 257/714; 165/80.4
(58) Field of Classification Search .................. 361/698, 361/699, 718, 719; 257/704, 710, 714, 717; 165/80.4; 372/34–36
See application file for complete search history.

(56) References Cited

U.S. PATENT DOCUMENTS

| | | | | |
|---|---|---|---|---|
| 3,616,533 A * | 11/1971 | Heap et al. | ...................... | 29/837 |
| 4,704,658 A * | 11/1987 | Yokouchi et al. | ............. | 361/698 |
| 4,765,397 A * | 8/1988 | Chrysler et al. | ......... | 165/104.33 |
| 4,995,892 A * | 2/1991 | Garrett et al. | .................... | 65/379 |
| 5,006,924 A * | 4/1991 | Frankeny et al. | ............. | 257/714 |
| 5,014,161 A * | 5/1991 | Lee et al. | ....................... | 361/709 |
| 5,168,919 A * | 12/1992 | Berenholz et al. | ........... | 165/80.4 |
| 5,305,184 A * | 4/1994 | Andresen et al. | ............. | 361/699 |
| 5,448,108 A * | 9/1995 | Quon et al. | .................... | 257/714 |
| 5,485,671 A * | 1/1996 | Larson et al. | ............. | 29/890.032 |
| 5,495,490 A * | 2/1996 | Rice et al. | ........................ | 372/34 |
| 5,720,338 A * | 2/1998 | Larson et al. | ................... | 165/46 |
| 5,763,950 A | 6/1998 | Fujisaki | | |
| 5,774,334 A * | 6/1998 | Kawamura et al. | ........... | 361/699 |
| 5,978,220 A * | 11/1999 | Frey et al. | ..................... | 361/699 |
| 6,052,284 A * | 4/2000 | Suga et al. | .................... | 361/699 |
| 6,253,835 B1 | 7/2001 | Chu | | |
| 6,351,384 B1 * | 2/2002 | Daikoku et al. | .............. | 361/704 |
| 6,717,812 B1 | 4/2004 | Pinjala | | |

(Continued)

FOREIGN PATENT DOCUMENTS

EP    1662852 A1    5/2006

*Primary Examiner* — Anatoly Vortman
(74) *Attorney, Agent, or Firm* — Jon A. Gibbons; Fleit Gibbons Gutman Bongini & Bianco PL

(57) ABSTRACT

The invention relates to an integrated circuit stack (1) comprising a plurality of integrated circuit layers (2) and at least one cooling layer (3) arranged in a space between two circuit layers (2). The integrated circuit stack (1) is cooled using a cooling fluid (10) pumped through the cooling layer (3). The invention further relates to a method for optimizing a configuration of such an integrated circuit stack (1).

20 Claims, 12 Drawing Sheets

U.S. PATENT DOCUMENTS

| | | | |
|---|---|---|---|
| 6,724,792 B2 * | 4/2004 | Rice | 372/36 |
| 6,744,136 B2 * | 6/2004 | Dubhashi | 257/714 |
| 7,030,317 B1 * | 4/2006 | Oman | 174/541 |
| 7,077,189 B1 * | 7/2006 | Reyzin et al. | 165/80.4 |
| 7,133,286 B2 * | 11/2006 | Schmidt et al. | 361/718 |
| 7,205,653 B2 * | 4/2007 | Brandenburg et al. | 257/714 |
| 7,365,981 B2 * | 4/2008 | Myers et al. | 361/699 |
| 7,411,290 B2 * | 8/2008 | Lee et al. | 257/712 |
| 7,551,439 B2 * | 6/2009 | Peugh et al. | 361/699 |
| 7,608,924 B2 * | 10/2009 | Myers et al. | 257/714 |
| 7,660,335 B2 * | 2/2010 | Thiagarajan et al. | 372/34 |
| 7,768,777 B2 * | 8/2010 | Miller | 361/679.53 |
| 7,990,711 B1 * | 8/2011 | Andry et al. | 361/699 |
| 8,014,150 B2 * | 9/2011 | Campbell et al. | 361/700 |
| 8,094,454 B2 * | 1/2012 | Lowry | 361/699 |
| 2001/0033477 A1 * | 10/2001 | Inoue et al. | 361/718 |
| 2002/0162673 A1 * | 11/2002 | Cook et al. | 174/35 MS |
| 2003/0053294 A1 * | 3/2003 | Yamada et al. | 361/699 |
| 2003/0080413 A1 * | 5/2003 | Dubhashi | 257/714 |
| 2004/0251530 A1 * | 12/2004 | Yamaji | 257/686 |
| 2005/0128702 A1 | 6/2005 | Mongia | |
| 2005/0269665 A1 | 12/2005 | Wylie | |
| 2008/0179736 A1 | 7/2008 | Hartwell | |
| 2008/0272485 A1 * | 11/2008 | Myers et al. | 257/714 |
| 2010/0208427 A1 * | 8/2010 | Horiuchi et al. | 361/699 |

* cited by examiner

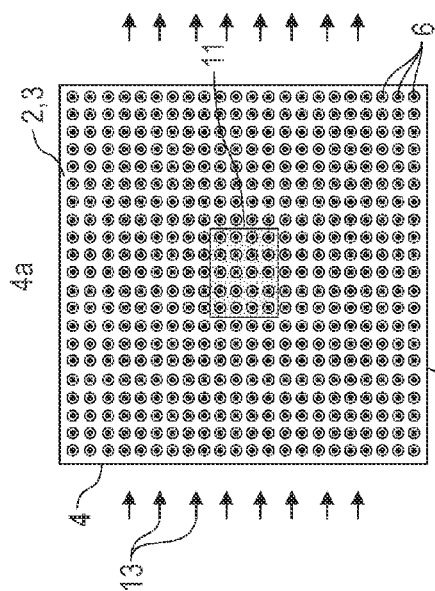
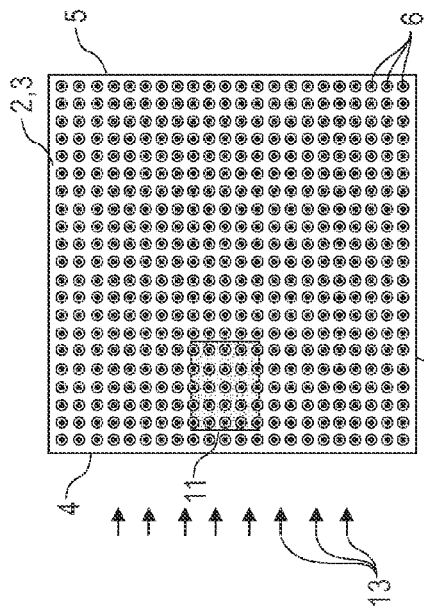
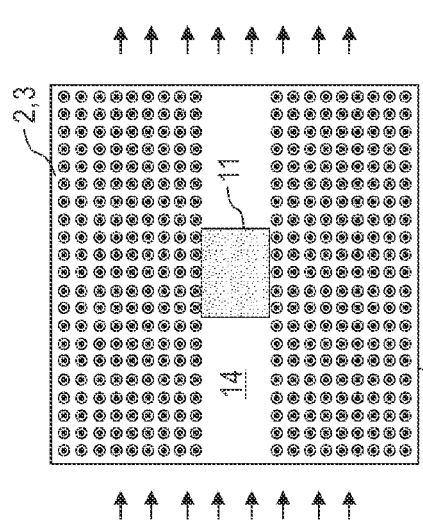
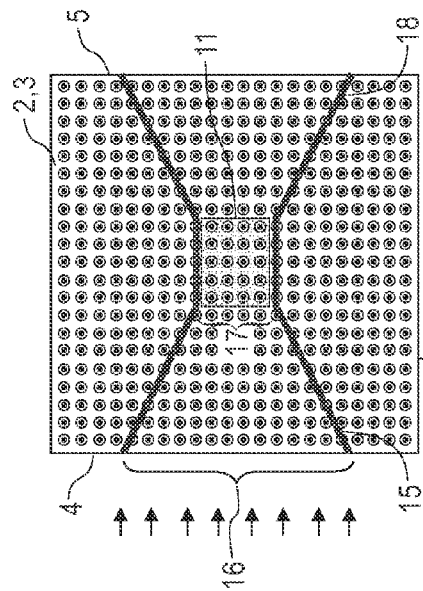
FIG. 3
FIG. 4
FIG. 5
FIG. 6

INTEGRATED CIRCUIT STACK

TECHNICAL FIELD

The present invention relates to the thermal management of integrated circuits. In particular, the present invention relates to an integrated circuit stack comprising a plurality of integrated circuit layers comprising at least a first circuit layer electrically connected to a second circuit layer and at least one cooling layer arranged in a space between the first and second circuit layer.

BACKGROUND OF THE INVENTION

The cooling of integrated circuits, of which increased performance expectations are placed, i.e. high-performance integrated circuits, is a particular challenge in a time of ever increasing circuit integration and performance demands. With increased computing requirements, so too do the processing speeds of integrated circuits and thus their clock frequencies increase, which leads to increased power consumption and, thus, heat dissipation. By a reduction in the size of individual components, such as transistors and memory cells, these components become faster. For electrical on-chip interconnects the opposite is the case. Due to the scaling effect the RC-time constant increases, which results in an increased signal flight time. This effect limits the chip performance and is called reverse scaling.

In known integrated circuits, most circuit components are arranged in what is essentially a single plane of a semiconductor material, often referred to as a die. Such a configuration allows increased efficiency in the cooling of the integrated circuit by means of a cooling arrangement mounted on the back surface of the integrated circuit. However, for the reduced length of signaling paths between individual circuit components, which translates in reduced signal flight times, and, also, to further aid chip integration, integrated circuit stacks are being developed, comprising multiple circuit layers stacked on top of each other. Cooling of such devices from the back side is particularly challenging as the dissipated heat flux of all the components accumulates and the conductive thermal resistance is increased with each additional component or circuit layer. This results in a higher temperature gradient in the chip stack.

An alternative cooling approach is the interlayer thermal management of such vertically integrated chip stacks. Such an approach is described in "Direct Liquid Cooling of a Stacked Multichip Module" by X. Y. Chen, K. C. Toh, and J. C. Chai. Therein, direct single-phase liquid cooling of a stacked multichip module is examined. A further integrated circuit stack is described in a paper titled "Integrated Microchannel Cooling for Three-Dimensional Electronic Circuit Architectures" by J.-M. Koo, S. Im, L. Yang and K. E. Goodson. This paper studies three-dimensional circuit cooling by means of an integrated microchannel network. A further integrated circuit stack with interlayer cooling is known from a paper titled to "Process Integration of 3D Chip Stack with Vertical Interconnection" by K. Takahashi, Y. Taguchi, M. Tomisaka et al.

So far arrangements for cooling integrated circuit stacks with interlayer cooling are either concerned with the cooling of relatively low-performance integrated circuits, in particular memory modules, having a uniform structure and heat-dissipation or stacks with just peripheral electrical interconnects for lower bandwidth applications.

It remains a challenge to provide integrated circuit stacks for other kinds of applications, such as high-performance processors. It is a further challenge to provide a method for configuring integrated circuit stacks for higher-power operation and more efficient cooling. It is a further challenge to provide an integrated circuit stack and a method for its thermal management, which is applicable to smaller channel geometries, for example, of less than 300 µm gap between individual circuit layers.

SUMMARY OF THE INVENTION

According to an embodiment of one aspect of the invention, an integrated circuit stack is provided. The integrated circuit stack comprises a plurality of integrated circuit layers comprising at least a first circuit layer electrically connected to a second circuit layer, the first circuit layer having at least one first area of higher heat generation and at least one second area of lower heat generation, and at least one cooling layer arranged in a space between the first and second circuit layer, the cooling layer comprising at least one fluid inlet, at least one fluid outlet and a hollow space hydraulically connecting the fluid inlet and the fluid outlet for cooling at least the first circuit layer using a cooling fluid. The at least one cooling layer comprises a means for creating a non-uniform flow pattern for the cooling fluid in the hollow space resulting in a higher heat transfer in the first area than in the second area of the first circuit layer.

By providing a means for creating a non-uniform flow pattern in a cooling layer arranged between a first and a second circuit layer of an integrated circuit stack, the heat transfer capability provided by a cooling fluid is adapted according to cooling requirements of the first and second area of the first circuit layer.

According to an embodiment of the first aspect, the at least one cooling layer comprises at least one guide element directing at least part of the cooling fluid towards the first area. By providing at least one guide element, which directs at least part of the cooling fluid towards the first area, a cooling effect in a first area having a higher heat generation is further improved.

According to a further embodiment of the first aspect, the at least one guide element is adapted for creating at least one first flow passing the first area having a higher mass flow rate than a second flow passing the second area. By creating a first and second flow having a higher and lower mass flow rate, respectively, the cooling performance in the first area is enhanced with respect to the second area.

According to a further embodiment of the first aspect, the at least one guide element comprises a funnel structure having a first larger opening towards the fluid inlet and a second smaller opening towards the first area. By integrating a funnel structure into the at least one cooling layer, a flow of cooling fluid is condensed in the first area resulting in an improved cooling of the first area.

According to a further embodiment of the first aspect, the at least one cooling layer comprises a channel structure having a first width in the first area and a second width in the second area, the first width being smaller than the second width. By providing a channel structure having different widths in the first and second area, the velocity of the cooling fluid is adapted to their different cooling requirements.

According to a further embodiment of the first aspect, the width of the channel structure is reduced along at least one path from the fluid inlet to the fluid outlet. By providing a channel structure, whose width is reduced along a path of the cooling fluid, the velocity of the cooling fluid is adapted to the decreasing cooling capacity of the cooling fluid along the path.

According to a further embodiment of the first aspect, the at least one cooling layer comprises a grid structure having a lower density in the first area than in the second area. By increasing the density of the grid structure in the second area with respect to the first area, the flow to resistance in the second area is increased, resulting in an increased flow of cooling fluid through the first area.

According to a further embodiment of the first aspect, the at least one cooling layer comprises a grid structure having grid elements, at least one first grid element arranged in the first area having a larger cross-section than a second grid-element arranged in the second area. By changing the cross-section of grid elements arranged in the first and second area, the heat transfer in the first and second area is adapted to their respective cooling requirements.

According to a further embodiment of the first aspect, the grid structure comprises electrical connections between the first and second circuit layer. By using electrical connections between the first and second circuit layer in order to form a grid structure, both the electrical connectivity between the different circuit layers and an adaptation of the flow of the cooling fluid through the cooling layer is achieved.

According to a further embodiment of the first aspect, the at least one cooling layer comprises a first surface at the first circuit layer and a second surface at the second circuit layer, the first and second surface having a smaller distance between each other in the first area than in the second area. By reducing the distance between the first and second surface of the at least one cooling layer in the first area, a flow of cooling fluid is accelerated in the first area, resulting in an improved cooling performance.

According to a further embodiment of the first aspect, the distance between the first and second surface is reduced along at least one path from the fluid inlet to the fluid outlet. By reducing the distance between the first and second surface, the velocity of the flow along the at least one path is accelerated toward the fluid outlet, equaling the heat transfer capability along the path caused by the heating up of the cooling fluid.

According to a further embodiment of the first aspect, the fluid inlet is placed closer to the first area than to the second area. By placing the first area, having a higher heat generation, closer to the fluid inlet than the second area, cooling in the first area is increased due to the comparably lower temperature of the cooling fluid at the fluid inlet than at/closer to the fluid outlet.

According to a further embodiment of the first aspect, the fluid outlet is placed closer to the second area than to the first area. By placing the second area, having a lower heat generation, closer to the fluid outlet, cooling in the second area is reduced as the cooling fluid has already heated up on its way from the fluid inlet to the second area.

According to a further embodiment of the first aspect, the fluid inlet and fluid outlet are arranged in proximity to a common corner of the cooling layer and the first area is arranged closer to the common corner than the second area. By arranging the first area in proximity of a corner common to a fluid inlet and a fluid outlet, the first area of higher heat generation is placed in a direct connection between the fluid inlet and the fluid outlet resulting in an increased mass flow rate of cooling fluid towards the common corner.

According to a further embodiment of the first aspect, the cooling layer comprises at least two fluid inlets and at least two fluid outlets, such that a first flow from the first inlet to the first outlet passing the first area is shorter than a second flow from the second fluid inlet to the first fluid outlet or from the first fluid inlet to the second fluid outlet, respectively. By placing the first area in a first flow having a reduced length with respect to a second flow, cooling of the first area is enhanced with respect to the second area.

According to a further embodiment of the first aspect, the cooling layer has a rectangular shape, having four sides, the first and the third side being parallel to each other, and the second and the fourth side being parallel to each other, the first and the third side being orthogonal to the second and the fourth side. The cooling layer comprises two fluid inlets and two fluid outlets arranged on the fourth sides. By using a four-port cooling fluid supply, the mass flow rate of the cooling fluid in the cooling layer can be further improved resulting in better heat dissipation for high-performance integrated circuits.

According to a further embodiment of the first aspect, the two fluid inlets are arranged on the first and the third side and two fluid outlets are arranged on the second and the fourth side. By providing the fluid inlets and fluid outlets on opposite sides of the cooling layer, a faster flow of cooling fluid is created at four corners, increasing the cooling performance there.

According to a further embodiment of the first aspect, the two fluid inlets are arranged on the first and the second side and two fluid outlets are arranged on the third and the fourth side. By providing the fluid inlets and fluid outlets on opposite sides of the cooling layer, a faster flow of cooling fluid is created at two corners, while preserving a constant flow in a central area of the cooling layer.

According to a further embodiment of the first aspect, the integrated circuit stack comprising at least a first and a second cooling layers arranged above and below at least one common circuit layer, wherein a flow of the cooling fluid in the first cooling layer is directed in a first direction and a flow of the cooling fluid in the second cooling layer is directed in a second direction, being different from the first direction. By directing a first and a second flow of cooling fluid in a first and a second cooling layer in different directions, the overall cooling of an intermediate circuit layer is adapted to its cooling requirements.

According to a further embodiment of the first aspect, the integrated circuit stack comprising at least a plurality of cooling layers, wherein a flow of the cooling fluid in alternating cooling layers is directed in opposite directions. By directing flows of cooling fluid in alternating cooling layers in opposite directions, the overall cooling performance is equalized.

According to an embodiment of a second aspect of the present invention, a method for configuring an integrated circuit stack comprising at least a first and a second circuit layer, the first and the second circuit layer being electrically connected to one another, at least the first circuit layer having a non-uniform power distribution and a hollow cooling layer arranged between the first and second circuit layer is provided. The method comprises the steps:

computing a junction temperature of a first and a second area of the first circuit layer for a given flow of a cooling fluid through the hollow cooling layer in a given configuration, and modifying the configuration of the cooling layer or the first circuit layer to reduce a difference in the computed junction temperature of the first and the second area of the first circuit layer.

By reducing a difference in the computed junction temperature of a first and second area of a first circuit layer, the thermal design of the integrated circuit stack is improved.

According to a further embodiment of the second aspect, the step of modifying the configuration comprises adding, removing or changing at least one guide element or surface feature of the cooling layer or the circuit layer in such a way that the mass flow rate in the first area having an above average junction temperature is increased or the mass flow rate in the second area having a below average junction temperature is reduced, or both. By modifying a guide element or surface feature of the cooling layer or circuit layer in order to increase or decrease the mass flow rate of the cooling fluid or the convective thermal resistance of the first and second area, respectively, the thermal design of the integrated circuit stack is improved.

According to a further embodiment of the second aspect, the steps of computing and modifying are repeated until a uniform junction temperature is computed for the first and second area of the circuit layer. By repeating the above steps until a uniform junction temperature is computed for both areas of the first circuit layer, the temperature of different circuit areas can be balanced.

According to a further embodiment of the second aspect, the steps of computing and modifying are repeated until a uniform junction temperature is computed for the entire surface of the circuit layer. By repeating the steps of computing and modifying until a uniform junction temperature is computed for the entire surface, the heat dissipation can be optimized for the entire circuit layer of the integrated circuit stack, achieving an optimal configuration for the integrated circuit stack.

BRIEF DESCRIPTION OF THE DRAWINGS

The invention and its embodiments will be more fully appreciated by reference to the following detailed description of presently preferred but nonetheless illustrative embodiments in accordance with the present invention when taken in conjunction with the accompanying drawings.

The figures are illustrating.

Figure 1:
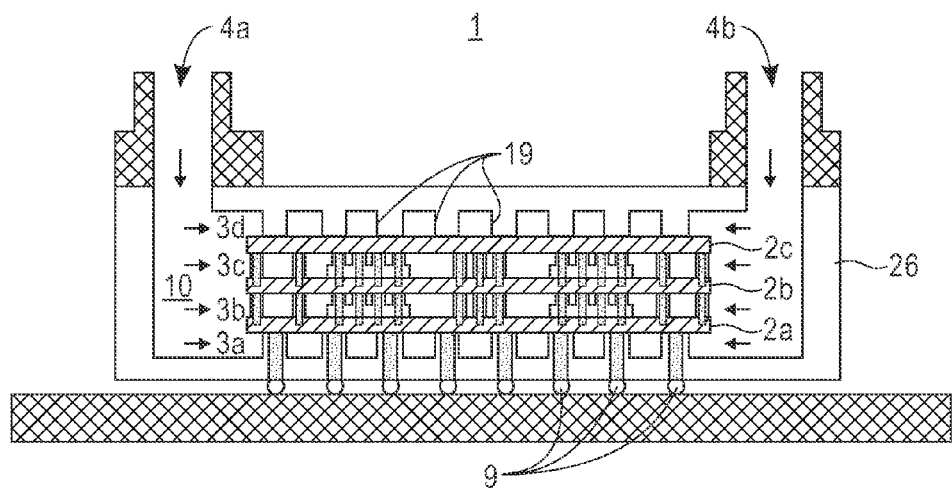
FIG. 1, an integrated circuit stack embedded into a fluid containment structure according to an embodiment of the invention, FIG. 2, an integrated circuit stack embedded into the fluid containment structure according to an embodiment of the invention, FIG. 3, a uniform pin fin array with a central hot spot according to a conventional design, FIG. 4, a uniform pin fin array with a hot spot at a fluid inlet according to an embodiment of the invention, FIG. 5, a cooling layer having a central low flow resistance channel according to an embodiment of the invention, FIG. 6, a cooling layer having a guiding structure to redistribute a heat flow according to an embodiment of the invention, FIG. 7A and FIG. 7B, cooling layers comprising a combination of various features for optimizing a cooling performance according to embodiments of the invention, FIG. 8A and FIG. 8B, a cross-section and a simulated heat dissipation of a cooling layer according to an embodiment of the invention, FIG. 9A to 9F, diagrams explaining the cooling performance according to the embodiment shown in FIG. 8, FIG. 10A and FIG. 10B, a cross-section and a simulated heat dissipation of a cooling layer according to an embodiment of the invention, FIG. 11A to FIG. 11D, diagrams explaining the cooling performance of the cooling layer in accordance with FIG. 10, FIG. 12, a cooling layer having four ports for a cooling fluid in a first configuration according to an embodiment of the invention, FIG. 13, a cooling layer having four ports for a cooling fluid in a second configuration according to an embodiment of the invention, FIG. 14, a cooling layer having four ports for a cooling fluid and other features for optimizing a cooling performance according to an embodiment of the invention, FIG. 15, a cross-section through an integrated circuit stack, FIG. 16, a temperature lift of a junction temperature of the integrated circuit stack according to FIG. 15, FIG. 17, a flow chart of a method for optimization of a circuit stack according to an embodiment of the invention, FIG. 18, a cooling layer having integrated channel structures according to an embodiment of the invention, FIGS. 19A and 19B, a cross-sections through cooling layers having variable grid densities according to embodiments of the invention, FIG. 20, a cooling layer having integrated channel structures according to an embodiment of the invention, and FIGS. 21A and 21B, cooling layers in multi-port arrangement having integrated channel structures according to embodiments of the invention.

In the drawings, common reference signs are used to refer to like elements in different embodiments. In addition, added postfixes in the form of characters are used to distinguish individual elements of a group of similar elements. In cases where no such distinction is made in the corresponding description, any element of that group may be referred to.

DETAILED DESCRIPTION OF THE DRAWINGS

Figure 15:
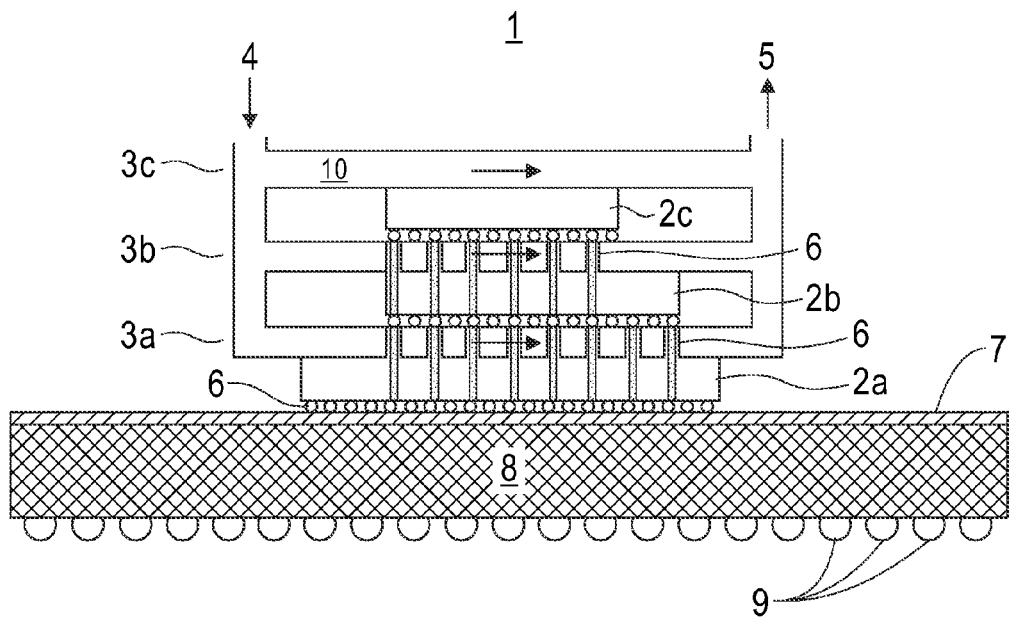

FIG. 15 shows a cross-section through an integrated circuit stack 1 having a plurality of integrated circuit layers 2. The integrated circuit stack 1 shown in FIG. 1 comprises three circuit layers 2a, 2b and 2c. Between each two circuit layers 2, a cooling layer 3 is provided. In addition to cooling layer 3a and 3b arranged between the circuit layers 2a and 2b, and 2b and 2c, respectively, an additional cooling layer 3c on top of the circuit layer 2c is provided.

Each of the cooling layers 3 provides a hollow space between adjoining circuit layers 2 and has a fluid inlet 4 and a fluid outlet 5. In the example presented in FIG. 15, all three cooling layers 3 are arranged and connected in parallel to a common fluid inlet 4 and a common fluid outlet 5.

For electrically connecting different integrated circuit layers 2 with one another, vertical electrical connections 6 which can be arranged in a true area array are passed through the cooling layers 3. Further electrical connections 6 are provided between the circuit layer 2a and a contact surface 7 arranged on a substrate 8. The contact surface 7 and the substrate 8 are used for providing electrical connections for the integrated circuit stack 1 to a printed circuit board, for example. For this purpose, the substrate 8 comprises for example multiple solder balls acting as contact pads 9, to connect the integrated circuit stack 1 with a ball grid array (BGA) of a carrier or substrate. Alternatively, the integrated circuit stack 1 may also be soldered directly onto a printed circuit board (PCB) or connected directly or indirectly by any other known or future bounding technology.

The thermal management of a three-dimensional integrated circuit stack 1 as shown in FIG. 15 is challenging since each circuit layer 2 adds to the overall heat dissipation of the stack. At the same time, limited space is available for convective heat removal between the circuit layers 2. To realize electrical connections 6 for high bandwidth communication, a gap provided between the individual circuit layers 2 is limited. For example, the thickness of the cooling layer 3 may be limited to less than 0.5 mm and will typically lie in a range between 50 and 500 μm.

In integrated circuit stacks 1 with an increased density of electrical connections 6, a flow rate of a cooling fluid 10 pumped through the cooling layers 3 is limited due to the increased flow resistance of the geometry of the integrated circuit stack 1. The result is a reduced mass flow rate for a given pressure drop from the fluid inlet 4 to the fluid outlet 5. In consequence, the main temperature lift of the semiconductor junctions embedded in the circuit layers 2 is caused by the increased temperature of the cooling fluid 10 which picks up the dissipated power, also referred to as "sensible heat" in the following.

Figure 16:
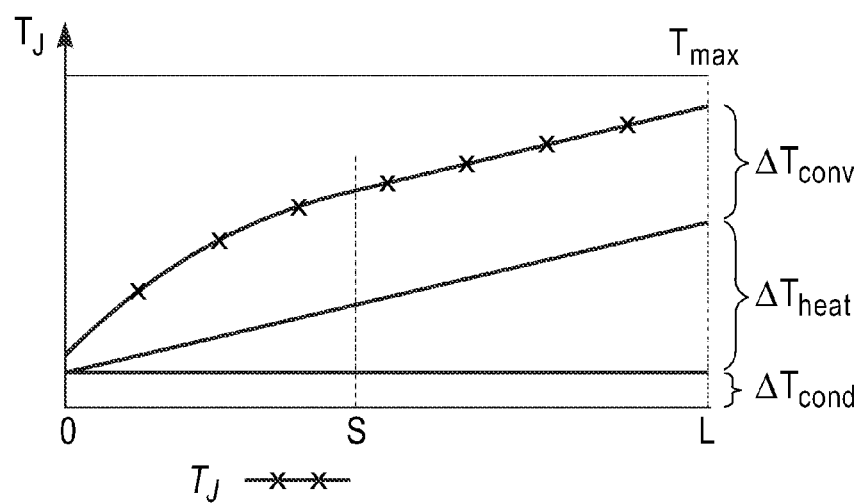

Various contributions to the junction temperature $T_J$ of a circuit layer 2 having a uniform heat to dissipation are represented in FIG. 16. The topmost curve of FIG. 16 shows the junction temperature $T_J$ of the integrated circuit layer 2 as a function of the distance of the junction from the fluid inlet 4. The plot starts at a location 0 at the fluid inlet 4 and ends at a position L at the fluid outlet 5 of the cooling layer 3.

As can be seen in FIG. 16, at first the junction temperature $T_J$ rises sharply until the critical temperature is reached at position S. This is due to the developing hydrodynamic and thermal boundary layer which results in a reduced convective thermal resistance up to the point, where the boundary layer is developed and the convective thermal resistance becomes constant. FIG. 16 shows the different contributions of conductive temperature increase $\Delta T_{cond}$, convective temperature increase $\Delta T_{conv}$ and fluid temperature increase due to sensible heat $\Delta T_{heat}$. In order to cool an area of the integrated circuit layer 2 arranged in proximity to the fluid outlet 5 at position L in such a way that a maximal junction temperature $T_{max}$ is not exceeded, the cooling fluid 10 must be pumped with relatively higher pressure through the integrated circuit stack 1.

The problem of cooling different areas of a circuit layer 2 is particular complicated, if the heat distribution of an integrated circuit layer 2 is non-uniform. This is particularly the case for high-performance processing devices, which comprise a relatively small processor core, for example for performing arithmetic operations, and a relatively large cache memory, which dissipates far less heat than the processor core. If a processor core would be arranged in the right-hand part of a circuit layer 2 according to FIGS. 15 and 16, an efficient cooling of that processor core would be almost impossible.

FIG. 1 shows a possible implementation of integrated circuit stacks 1 according to an embodiment of the invention. In the embodiment shown in FIG. 1, the integrated circuit stack 1 comprises three circuit layers 2a to 2c and four cooling layers 3a to 3d surrounding the circuit layers 2. The lowest circuit layer 2a is connected by means of contact pads 9, for example C4 solder balls, to a contact surface 7. Also, the circuit layers 2a to 2c are interconnected by electrical connections 6 between the individual circuit layers 2. In addition, the cooling layer 3d arranged between the topmost circuit layer 2c and a top surface 21 of a housing 26 of the integrated circuit stack 1, acting as containment structure for the cooling fluid 10, comprises guide elements 19 for adapting a flow 13 of the cooling fluid 10. As will to be described below, by adapting the circuit layers 2 or the cooling layers 3, cooling of the circuit stack 1 can be achieved with reduced pumping power for supplying the fluid inlet 4 and the fluid outlet 5.

In the embodiment shown in FIG. 1, two fluid inlets 4a and 4b on the left-hand side and right-hand side of the circuit stack 1 are provided. The cooling fluid 10 pumped into the fluid inlets 4a and 4b leaves the integrated circuit stack 1 towards the front and the back by means of fluid outlets 5a and 5b, although this is not shown in FIG. 1. Due to this and other features described below, a non-uniform flow pattern created in the cooling layer 3 enables high-performance operation of the multiple circuit layers 2a to 2c. In particular, an increased number of electrical connections 6 may be included in form of a true area arrangement. The cooling of the integrated circuit stack 1 can be increased by mounting an additional cooler on top of the top surface 21 in the area of the circuit layers 2. Such an additional cooler, although not shown in FIG. 1, may improve the overall cooling by means of heat conduction through the guide elements 19.

According to the presented embodiment, the electrical connections 6 may be realized with through wafer vias. The heat transfer geometry is structured into the silicon and can comprise a pin fin array. The circuit layers 2 may be bonded with an electrical conductive solder material, which forms an island, surrounded by a ring structure which seals the electrical interconnect from the cooling fluid 10. Both bonding areas conduct heat to the fins. The integrated circuit stack 1 is then packaged into a thermal expansion matched housing 26 such as silicon comprising a cooling fluid manifold and the contact pads 9 with the possibility of ball grid array bonding. This packaging approach reduces stress induced to the fragile circuit layers 2 from thermal expansion mismatch, allows two sided heat removal for all circuit layers 2 and a so-called four-port manifolding scheme described later.

Figure 2:
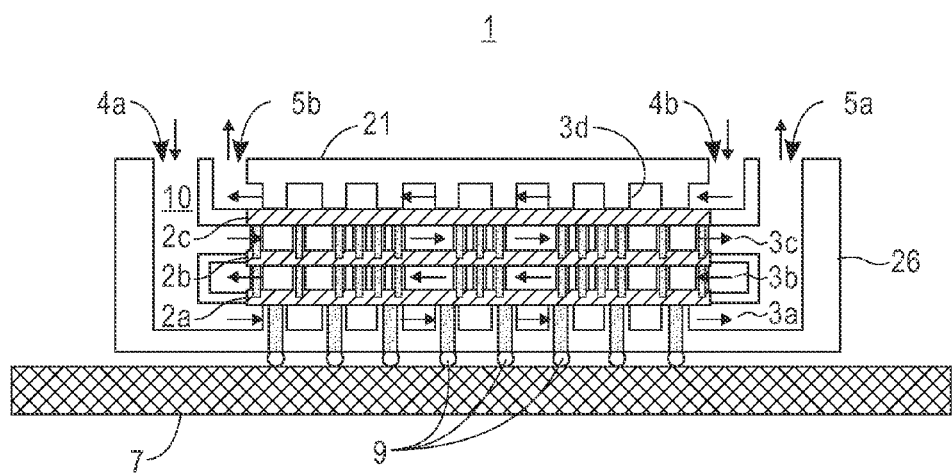

FIG. 2 shows an integrated circuit stack 1 similar to that shown in FIG. 1. In order to improve cooling of the integrated circuit stack 1 of FIG. 2, cooling layers 3a and 3c are connected to a first fluid inlet 4a on the left-hand side and a first fluid outlet 5a on the right-hand side, whereas cooling layers 3b and 3d are connected to a second fluid inlet 4b on the right-hand side and a second fluid outlet 5b on the left-hand side.

In consequence, the cooling fluid 10 flows through the cooling layers 3a to 3d in alternating directions above and below each circuit layer 2a to 2c. Because the circuit layers 2a to 2c are each arranged between two adjoining cooling layers 3a to 3d with alternating directions of flow, each circuit layer 2a to 2c is cooled from both the left-hand and the right-hand side. Considering the junction temperature $T_J$ and the cooling performance, as indicated in FIG. 16 for a cooling from one side only, a combined cooling from both the left-hand and the right-hand side will result in an improved cooling performance with an almost constant junction temperature $T_J$ across the entire breadth of the circuit layers 2a to 2d.

FIG. 3 shows a conventional integrated circuit layer 2 comprising a first area 11 in the center of the integrated circuit layer 2 and a second area 12 surrounding the first area 11. In the view shown in FIG. 3, projections of electrical connections 6 to the circuit layer 2 are also shown, which hamper a flow 13 of the cooling fluid 10 that, in the situation depicted in FIG. 3, flows from left to right. The flow 13 of cooling fluid 10 flows in a cooling layer 3, which is arranged directly over or underneath the circuit layer 2. The electrical connections 6 thus act as cooling fins for circuit components they are connecting. Consequently, such a structure is also referred to as a "pin fin array".

The conventional arrangement shown in FIG. 3 has the disadvantage that the cooling fluid 10 will heat up on the way from the fluid inlet 4 arranged on the left-hand side to the first area 11 in the center of the circuit layer 2. A uniform pin fin array with a hot spot in the center as shown in FIG. 3 or, even worse, at the end of a flow 13 has a very low pumping power efficiency. In these cases the cooling fluid temperature lift is already high in the first area 11.

Consequently the convective resistance has to be reduced at the cost of increased pumping power to keep the junction temperature below $T_{max}$.

FIG. 4 shows an improved arrangement according to an embodiment of the invention. In the embodiment shown in FIG. 4, the first area 11, comprising for example a processor core dissipating a large amount of heat, is arranged in proximity to the fluid inlet 4, whereas the second area 12 is arranged mainly to the right of the first area 11, i.e. closer to the fluid outlet 5. Consequently, the first area 11 receives a flow 13 of cooling fluid 10, which is still at a relatively low temperature, thus resulting in the increased cooling of the first area 11 with respect to the second area 12 than in the absence of this configuration. In consequence, the pressure drop between the fluid inlet 4 and the fluid outlet 5 can be reduced in the arrangement as shown in FIG. 4 with respect to the arrangement shown in FIG. 3.

FIG. 5 shows another arrangement of a circuit layer 2 with a cooling layer 3 arranged upon the circuit layer 2. In this particular embodiment, a channel 14 is arranged in the middle of the cooling layer 3. In particular, the channel 14 is formed by not having any electrical connections 6 in the area of the channel 14. In consequence, the flow resistance for the cooling fluid 10 provided from the fluid inlet 4 at the left-hand side of the cooling layer 3 is reduced in the channel 14 with respect to other parts of the cooling layer 3. Consequently, the mass flow rate in the channel 14 will be increased with respect to the mass flow rate above and below the channel 14. For this reason, the first area 11 arranged in the area of the channel 14 is cooled more efficiently than most parts of the second area 12 arranged in the area of electrical connections 6. Although the first area 11 comprising an area of relatively large heat dissipation is arranged in the center of the circuit layer 2, it can be cooled efficiently in the embodiment shown in FIG. 5.

FIG. 6 shows a further embodiment in accordance with the invention. The arrangement shown in FIG. 6 comprises a funnel structure 15 which has a first opening 16 on the left-hand side close to the fluid inlet 4 and a second opening 17 close to the first area 11. If a flow 13 of cooling fluid 10 is provided from left to right, i.e. from the fluid inlet 4 to the fluid outlet 5 of the arrangement shown in FIG. 6, the mass flow rate in the first area 11 is increased with respect to the second area 12. In particular, since cooling fluid 10 collected over the relatively wide first opening 16 must pass through the much smaller second opening 17, the velocity of the flow 13 is increased in the first area 11. An inverse funnel structure 18 on the right-hand side of the first area 11 helps to spread the flow 13 over the entire width of the cooling layer 3 once the flow 13 has passed the first area 11. In addition, due to the symmetry of the arrangement shown in FIG. 6, the fluid inlet 4 and the fluid outlet 5 can be exchanged. This means that the cooling fluid 10 may be provided in either direction without impairing the function of the arrangement shown in FIG. 6.

Figure 7A:
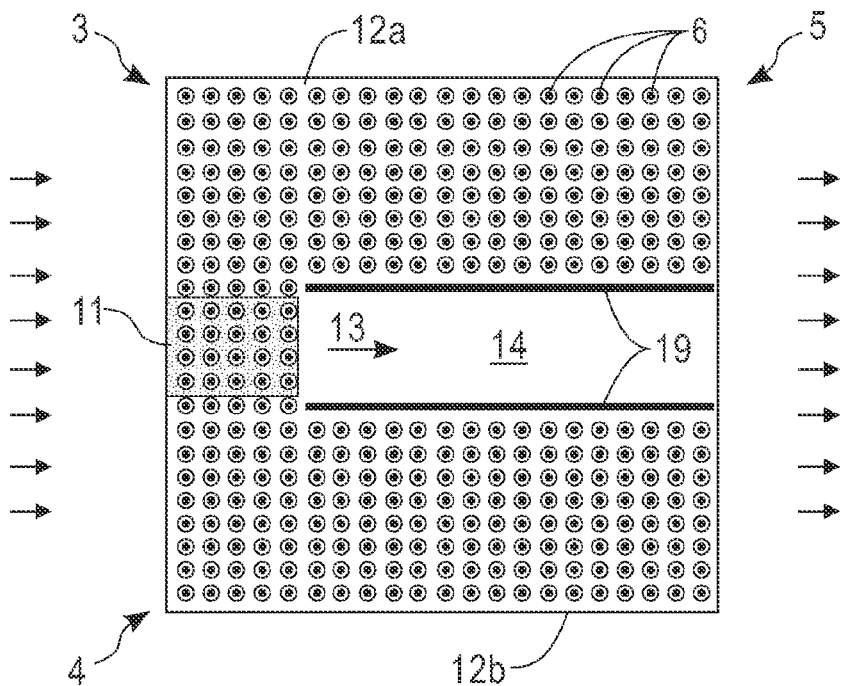

FIG. 7A shows a further arrangement combining various features of the embodiments described above. In particular, in FIG. 7A, the first area 11 is located close to a fluid inlet 4 to and arranged at an entrance to a channel 14. Guide elements 19 guide a flow 13 through the channel 14. In consequence, although electrical connections 6 are provided in the first area 11, which may be for the operation of the circuitry arranged in the first area 11, the overall flow resistance of a cooling fluid 10 through the first area 11 and the subsequent channel 14, which is void of any electrical connections 6, is below average. Inversely, the flow resistance of the cooling fluid 10 passing through the upper and lower part of the cooling layer 3, separated from the channel 14 by the guide elements 19 and having electrical connections 6 throughout is above average.

Figure 7B:
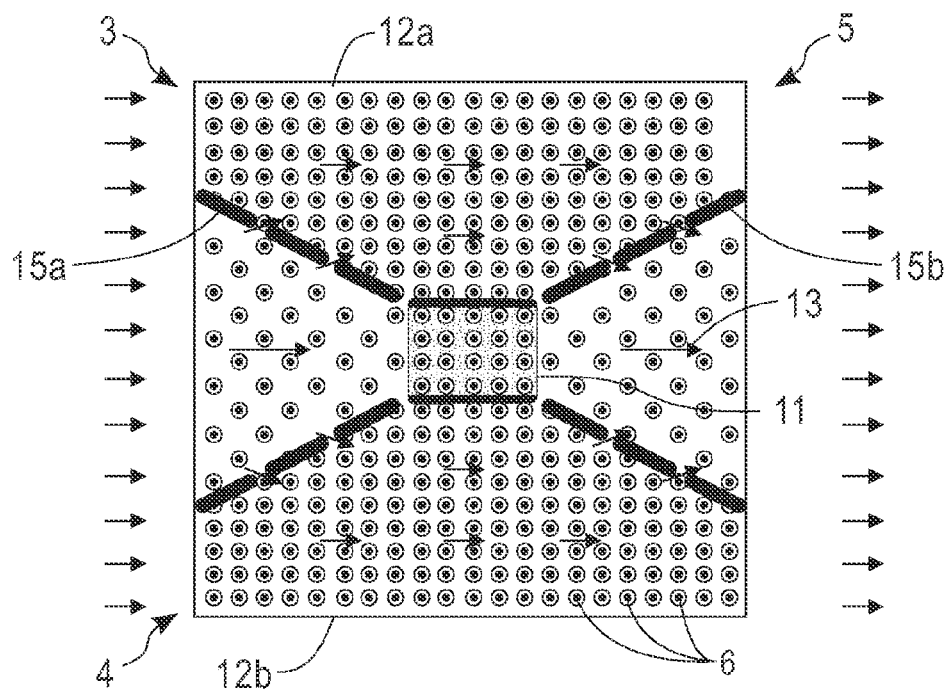

FIG. 7B shows another embodiment of a cooling layer 3 comprising discrete guide elements forming two funnel structures 15a and 15b. In addition, the electrical connections 6 passing through the cooling layer 3 are arranged with a higher density in second areas 12a and 12b in order to focus a flow 13 of cooling fluid 10 through the first area 11 corresponding to a hot spot 22. Other than the funnel structure 15 shown in FIG. 6, the funnel structures 15a and 15b are comprised of discrete elements allowing lower-rate secondary flows of cooling fluid 10 through the second areas 12a and 12b.

As seen above, a more uniform junction temperature $T_J$ close to the maximal junction temperature $T_{max}$ at the maximal chip load result in a more efficient cooling arrangement for a given power map. If, either the power map of the circuit layer 1 is designed according to the cooling layer's 3 local heat removal capability or the cooling layer 3 is designed for a given power map of a circuit layer 2, the overall cooling efficiency of the circuit stack 1 is improved. In both cases the heat removal design should consider the implementation density of electrical connections 6 in the given area.

A desirable configuration from an electrical and thermal prospective may be obtained by adjusting the power map of the circuit layer 2 as much as possible towards the thermal needs and to design the cooling layer 3 according to the power map. The result is a reduced pumping power due to a lower flow rate and pressure drop across the cooling layer 3 and a maximal fluid temperature at the fluid outlet 5.

In server applications, where many processors have to be cooled in parallel, reduced flow rate per die allows much smaller diameter tubing and therefore more compact cooling fluid interconnects in the server rack with a reduction in pumping power. The increased fluid outlet temperature causes a reduced secondary heat exchanger volume and weight due to the increased heat flux caused by the improved temperature difference of the two fluid loops or in best case eliminates the secondary cooling loop by direct exchange of the heat to the environment.

Figure 8A:
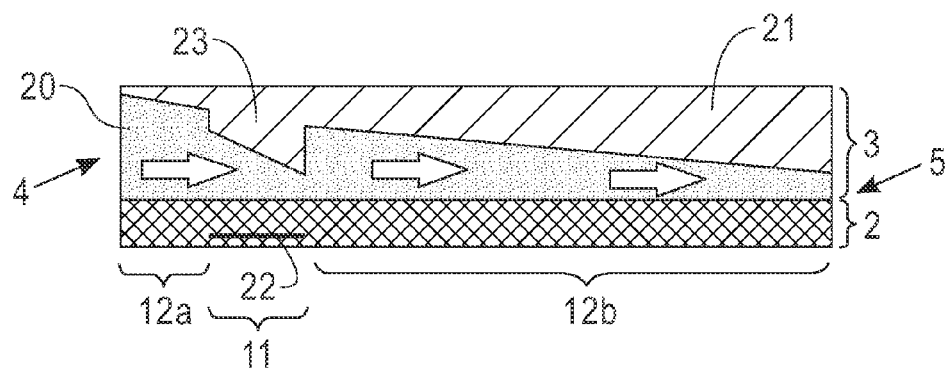

In view of theses considerations, FIG. 8A shows yet another embodiment in accordance with the invention. In particular, FIG. 8A shows the cross-section through a circuit layer 2 and a cooling layer 3 arranged on top of the circuit layer 2. The cooling layer 3 comprises a hollow space 20, which is filled by a cooling fluid 10, and a top surface 21. The integrated circuit layer 2 comprises a hot spot 22, i.e. a region of heat generation and/or elevated temperature compared to other regions of the circuit layer 2, for example, in a first area 11. Left and right of the first area 11 are second areas 12a and 12b, in which comparably less heat is dissipated from the circuit layer 2. As can be seen in the cross-section depicted in FIG. 8A, there is no additional layer arranged between the hollow space 20 and the integrated circuit layer 2. However, in case an electrically conductive cooling fluid 10 or a cooling fluid 10, which may react with parts of the circuit layer 2, is used, the circuit layer 2 may be protected by means of an oxide or similar protective layer.

FIG. 8A shows that the top surface 21 of the cooling layer 3 has a variable thickness and, thus, distance from the integrated circuit layer 2 on a path from the fluid inlet 4 on the left-hand side to the fluid outlet 5 on the right-hand side. In particular, the distance between the top surface 21 and the integrated circuit layer 2 is overall reduced from left to right, such that the velocity of the flow 13 of the cooling fluid 10 is accelerated from left to right with a resulting reduction in convective thermal resistance. In consequence, in the leftmost second area 12a, the cooling fluid 10 has a relatively low flow velocity. At this stage, the cooling fluid 10 has a relatively low temperature and allows a relatively high convective thermal resistance with its lower fluid flow resistance. In contrast, on the right-hand side of the second area 12b, the cooling fluid 10 has already been heated up by the heat dissipated in the first area 11 and can only accept relatively small amounts of temperature gradient caused by the convective heat transfer. To reduce the convective thermal resistance, the flow rate of the cooling fluid 10 is increased in the right-hand area by narrowing the gap limiting the hollow space 20.

In addition, an additional surface feature 23 is arranged on the top surface 21 in the first area 11. The surface feature 23 narrows the distance between the top surface 21 and the circuit layer 2 in the first area 11 of the hot spot 22. For the reason set out above, the flow rate of the cooling fluid 10 is increased in the first area 11 resulting in an improved cooling of the hot spot 22.

Figure 18:
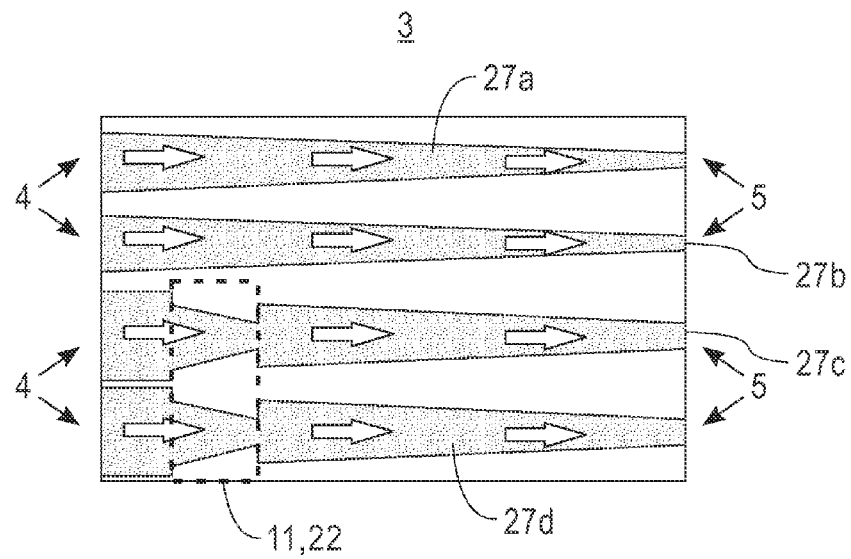
Figure 19A:
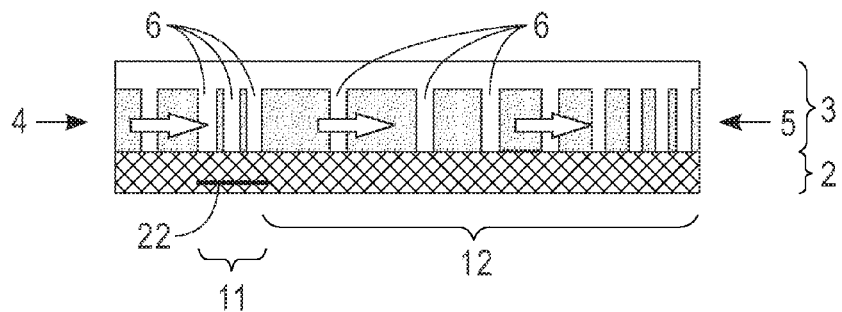
Figure 19B:
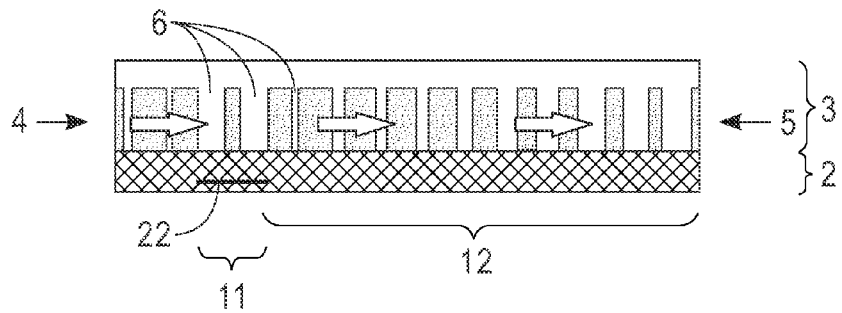

The described variable gap cooling scheme stands symbolically for other possible implementation schemes of a variable convective heat transfer cooling structure, such as variable width channels, shown in FIG. 18, or variable density pin fin arrays with guiding structures as shown in FIGS. 19A and 19B, described below. These and similar planar structures can be defined by conventional 2D-lithography and afterwards etched into the silicon or built up by electroplating.

Figure 8B:
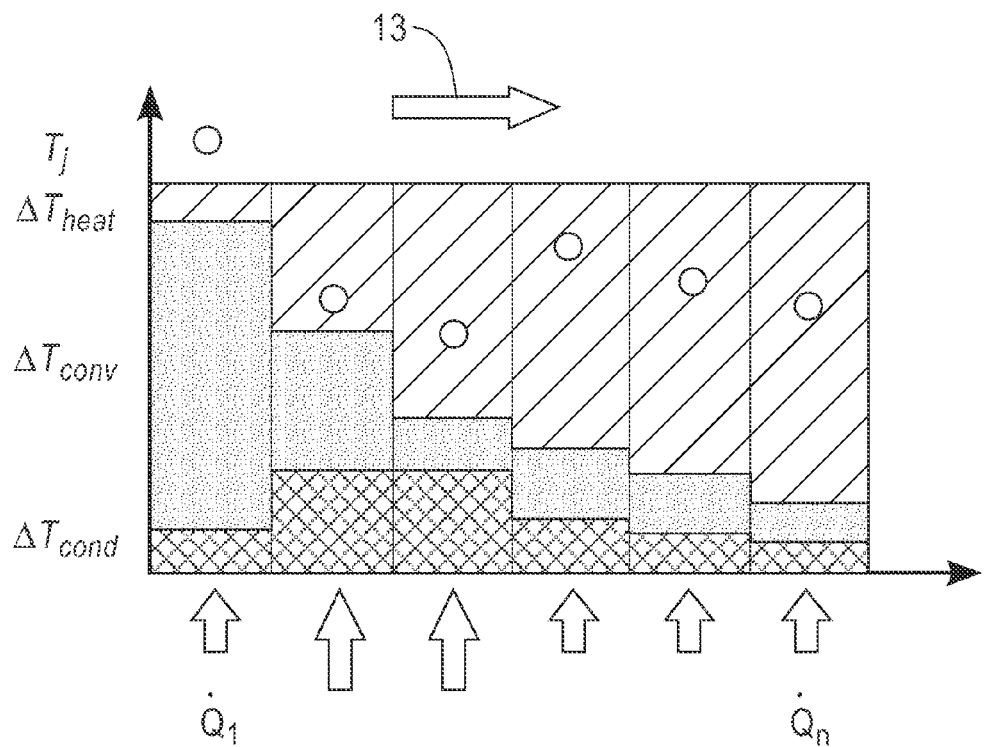
Figure 9A:
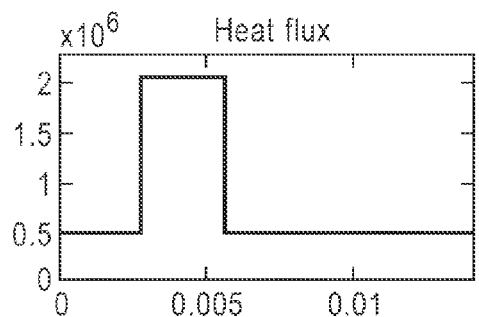
Figure 9B:
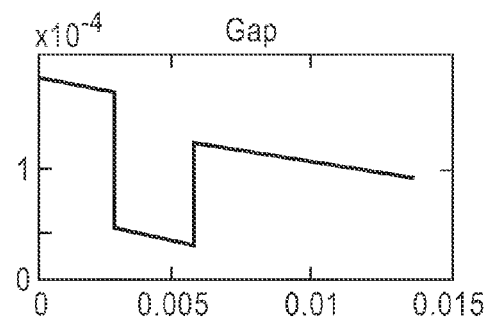
Figure 9C:
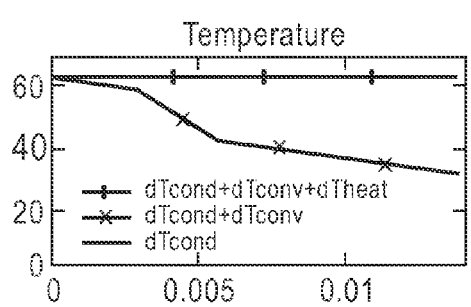
Figure 9D:
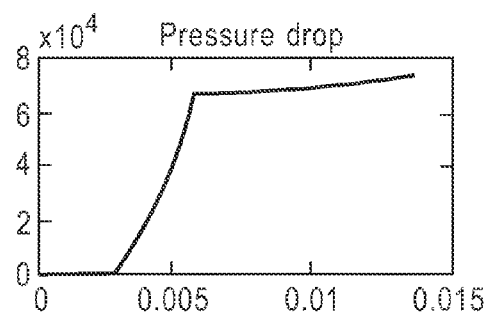
Figure 9E:
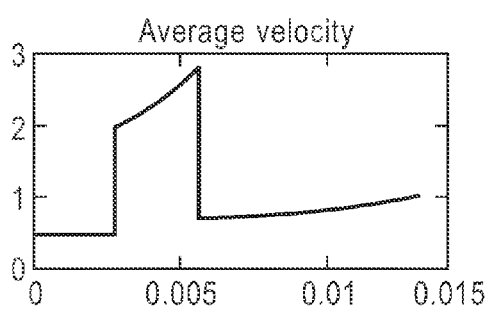
Figure 9F:
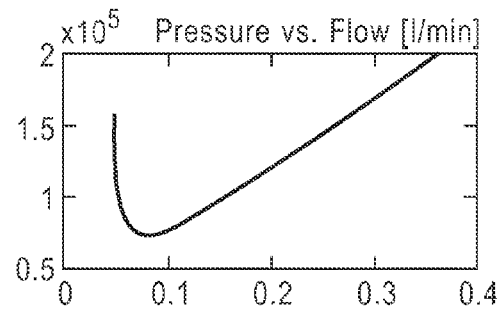

FIG. 8B shows the resulting junction temperature $T_J$ of the circuit layer 2 on the way from the fluid inlet 4 to the fluid outlet 5. The data represented in FIG. 8B has been computed from left to right for each area dissipating a known amount of heat $Q_1$ to $Q_n$. The circles in FIG. 8B represent the distance between the circuit layer 2 and the opposite top surface 21, i.e. the width of the gap provided for the cooling fluid 10. As can be seen in FIG. 8B, the junction temperature $T_J$ of the integrated circuit layer remains constant over the entire width of the integrated circuit layer 2.

FIG. 8B also shows the different contribution of convective heat $\Delta T_{conv}$, conductive heat $\Delta T_{cond}$ and sensible heat $\Delta T_{heat}$ to the junction temperature T. Because the integrated circuit layer 2 can be operated close to a critical junction temperature across its entire surface, the pressure drop and the flow rate between the fluid inlet 4 and the fluid outlet 5 can be reduced, thus increasing the efficiency of the cooling arrangement shown in FIG. 8A.

FIG. 9 shows various parameters relating to the heat transfer of the embodiment of an integrated circuit stack 1 in accordance with FIG. 8A. As can be seen in the various parts of FIG. 9, by modulating the gap width of the hollow space 20, the average velocity of the flow 13 and the pressure within the cooling fluid 10 can be modulated in order to allow a heat flux which is proportional to the amount of heat dissipated by the first area 11 and the second areas 12a and 12b, respectively.

In the embodiment shown in FIG. 8A and FIG. 8B, the gap is optimized for a given power map. The table shown below discloses results of different cooling arrangements having a variable and a constant gap along a flow 13 of the cooling fluid 10. The pressure drop for the adaptive gap test case can be reduced by a factor of 10.

|  | Variable gap | Uniform gap |
| --- | --- | --- |
| Total dissipated power: | 159.3 W | 159.3 W |
| Fluid outlet temp: | 54° C. | 36.9° C. |
| Max. Reynolds number: | 169 | 360 |
| Max. cooling fluid velocity: | 2.799 m/s | 5.33 m/s |
| Pressure drop: | 0.728 bar | 7.87 bar |
| Gap max: | 182.5 um | 33.8 um |
| Gap min: | 30.2 um | 33.8 um |
| Flow rate: | 0.0714 l/min | 0.152 l/min |

Figure 10A:
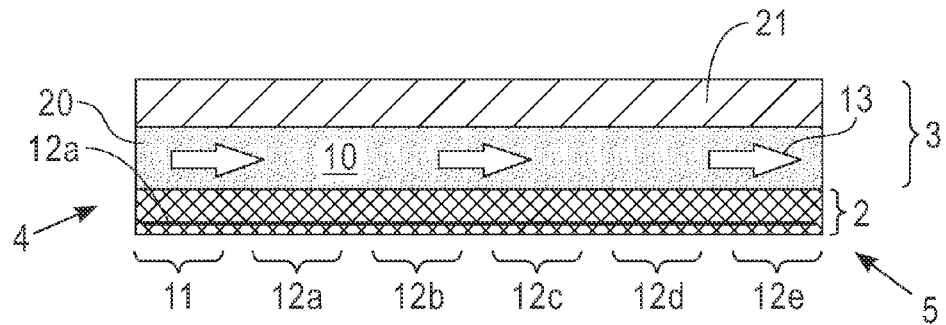
Figure 10B:
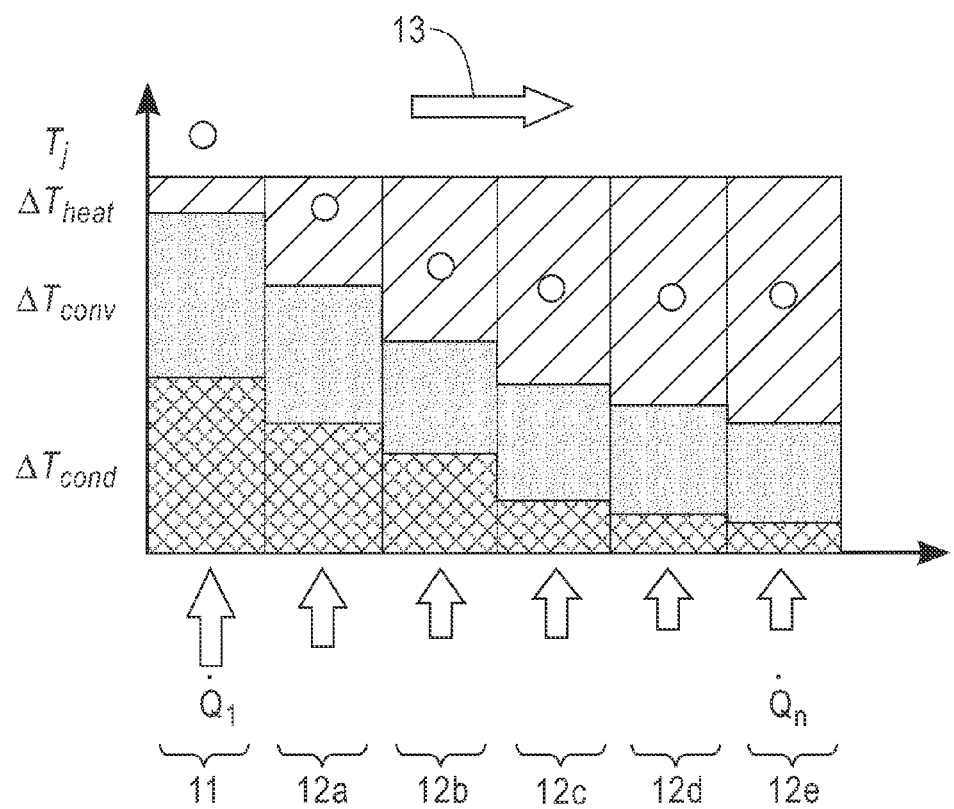

FIG. 10A and FIG. 10B show an alternative integrated circuit stack 1 arrangement comprising a circuit layer 2, a cooling layer 3 and a top surface 21. In the arrangement shown in FIG. 10A, the top surface 21 runs in parallel to the circuit layer 2. That is, the hollow space 20 of the cooling layer 3 has a uniform thickness across the entire circuit layer 2.

Calculations underlying FIG. 10A and FIG. 10B define the optimal power map for a parallel cooling layer 3 with a uniform gap and an undeveloped hydrodynamic and thermal boundary layer. For the same flow rate and pressure drop the maximal power that can be dissipated is 45% higher in the optimal power map case than for the uniform heat flux case. According to the embodiment, the effect of enhanced heat transfer at the fluid inlet 4 is considered during the design of each individual circuit layer 2 of the integrated circuit stack 1.

For increased cooling efficiency of the arrangement shown in FIG. 10A, the heat dissipation $Q_1$ to $Q_n$ of the circuit layer 2 is adapted to the increasing convective thermal resistance of the flow 13 of cooling fluid 10 flowing through the hollow space 20 from left to right. The heat dissipation $Q_1$ to $Q_n$ by the circuit layer 2 is indicated by the size of the arrows shown in FIG. 10B and decreases from left to right. The circles represent the Nusselt number $Nu_i$ for each section of the arrangement, which is a measure for heat transfer capability of a given surface to section of the circuit layer 2 to the cooling fluid 10 of the cooling layer 3.

In particular, in a first area 11, the heat dissipation of the circuit layer 2 is greatest. In subsequent second areas 12a to 12e, the heat dissipation decreases. Consequently, parts of the circuit layer 2 having particularly high heat dissipation are arranged closer to the fluid inlet 4, while parts of the circuit layer 2 having a lower heat dissipation are arranged closer to the fluid outlet 5. As a result, the junction temperature $T_J$ of the circuit layer 2 remains constant over the entire width of the circuit layer 2.

Figure 11A:
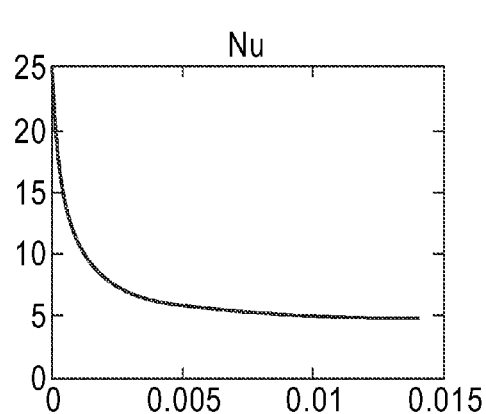
Figure 11B:
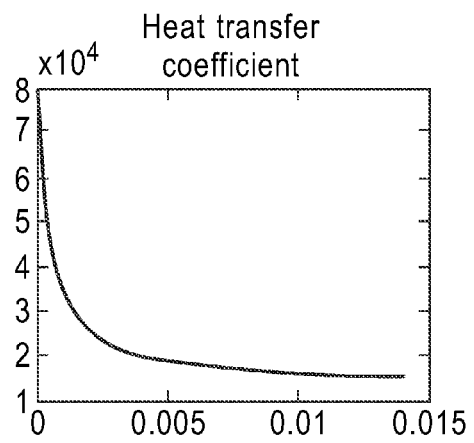
Figure 11C:
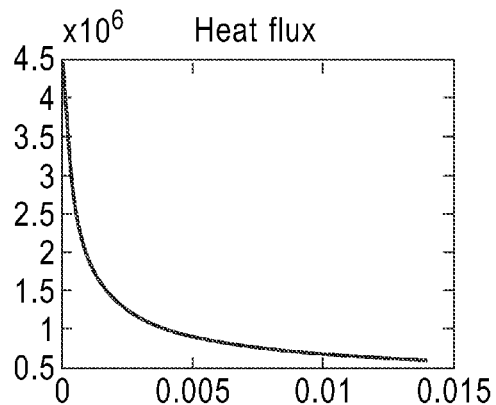
Figure 11D:
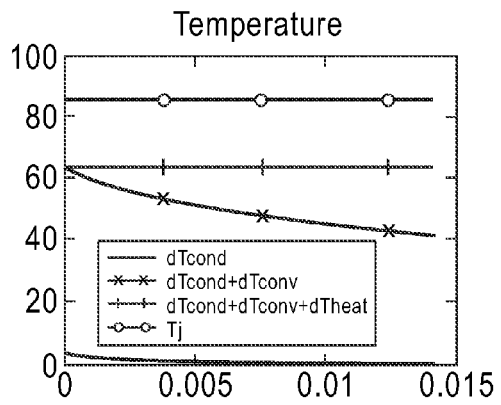

FIG. 11a to FIG. 11B show the Nusselt number, the heat transfer coefficient, the calculated optimal heat flux, the junction temperature $T_J$ and its variant constituting parts for the arrangement shown in FIGS. 10A and 10B.

The data provided in FIGS. 8B and 10B represent optimal systems, wherein a junction temperature $T_J$ is kept constant across an entire circuit layer 2. In practice, however, optimization may be limited to particular area or aspects of circuit layers 2. For example, optimization may be used to limit a junction temperature $T_J$ not to exceed a maximal junction temperature $T_{max}$ in a first area 11 corresponding to a known hot-spot 22 for a given pump power.

Figure 12:
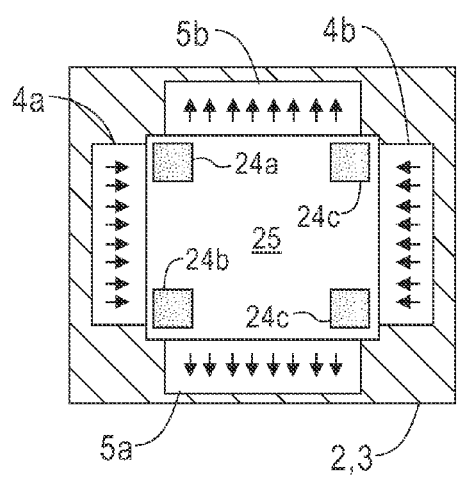
Figure 13:
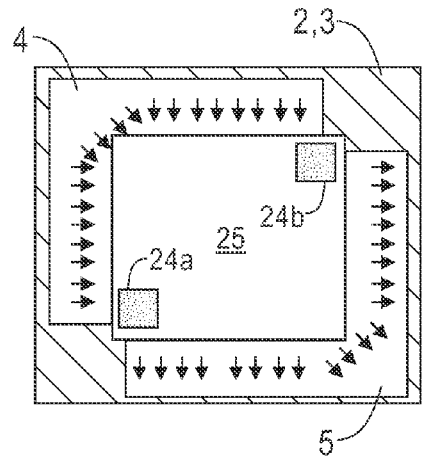

More efficient heat removal at small gap widths can also be realized by a so-called four-port cooling layer architecture described below. In the two port configuration the fluid inlet 4 and fluid outlet 5 are situated at opposite locations of the cooling layer 3, whereas in the four-port case all for sides of the cooling layer 3 are used to deliver and drain coolant. Fluid inlets 4 can be opposite and separated by fluid outlets 5 as shown in FIG. 12, referred to as twofold symmetry, or adjacent and connected at the corner of the cooling layer 3 as shown in FIG. 13, referred to as single symmetry. The inlet to outlet configuration results in relatively short fluid paths at corners 24 adjacent to fluid inlets 4 and fluid outlets 5.

FIG. 12 shows an arrangement according to an embodiment of the invention in the double symmetry configuration. In particular, FIG. 12 shows a top view of a circuit layer 2 and a cooling layer 3 in the so-called four-port configuration. In this configuration, a cooling fluid is fed into the cooling layer 3 from two opposite fluid inlets 4a and 4b and leaves the cooling layer 3 by means of two fluid outlets 5a and 5b arranged between the fluid inlets 4a and 4b.

In the arrangement shown in FIG. 12, the cooling fluid 10 flows into the cooling layer 3 from left and right and leaves the cooling layer 3 towards the top and bottom. Unlike in cooling arrangements, in which cooling fluid 10 is pumped in from one side and flows out on the opposite side, the arrangement shown in FIG. 2 will develop a non-uniform flow distribution within the cooling layer 3. In particular, the flow 13 of cooling fluid 10 will move more rapidly close to the corners 24a to 24d of the cooling arrangement shown in FIG. 12 in which hot spots 22a to 22d are located. Inversely, the central area 25 will be cooled less efficiently, as the flow 13 in this area is much slower. Consequently, the circuit layer 2 having four hot spots 22a to 22d is arranged in such a way that the hot spots 22a to 22d are co-located with the corners 24a to 24d for improved cooling.

FIG. 13 shows a circuit layer 2 with a cooling layer 3 in the single symmetry configuration arranged on top of it. In the arrangement shown in FIG. 13, a cooling fluid 10 is fed into the cooling layer 3 from two sides and flows out from the cooling layer 3 on the two remaining sides. Unlike in the embodiment shown in FIG. 12, in the embodiment shown in FIG. 13, the cooling fluid 10 flows into the cooling layer 3 from two neighboring sides. The flow 13 of cooling fluid 10 will evolve into a non-uniform flow pattern, which cools two corners 24a and 24b arranged close to both the fluid inlet 4 and the fluid outlet 5 more efficiently. Consequently, the circuit layer 2 having two hot spots 22a and 22b is arranged in such a way that the hot spots 22a and 22b are co-located with the corners 24a and 24b for improved cooling. Inversely, the remaining central area 25 is cooled less efficiently and may comprise parts of the circuit layer 2 which dissipate less heat.

The twofold symmetric approach is capable of handling four hot spots 22, each located in a corner 24 of the circuit layer 2, whereas the single symmetric case is capable of handling two hot spots 22 in corners 24 arranged between fluid inlet 4 and fluid outlet 5. The twofold symmetry case has a stagnation zone in the center of the cooling layer 3 with a low heat removal rate, which can be reduced using guiding structures as described above in order to minimize this low performing zone, by a central heat conduction structure or by a layer dependent offset of the stagnation zone from the center.

Computational fluid dynamic results have been used to compute the velocity field and the circuit layer surface temperature for a given uniform power dissipation. A two-port cooling layer 3 has a uniform fluid velocity, whereas a four-port cooling layer 3 shows a strong increase in fluid velocity towards the corner 24 of the cooling layer 3 and also has higher velocities at the central area 25 of the cooling layer 3 caused by the shear stress from the high velocity fluid in the first areas 22a and 22b. By increasing the x- and y-size of the cooling layer 3 the flow rate of the two-port cold plate stays constant. This results in a reduced cooling performance for larger circuit layers 2 since the mass flow rate normalized per area is decreasing. On the other hand, the total flow rate of the four-port cooling layer 3 increases. It was found that the surface temperature of the four-port cooling layer 3 is on 90% of the area lower then the temperature of the two-port cooling layer 3.

Figure 14:
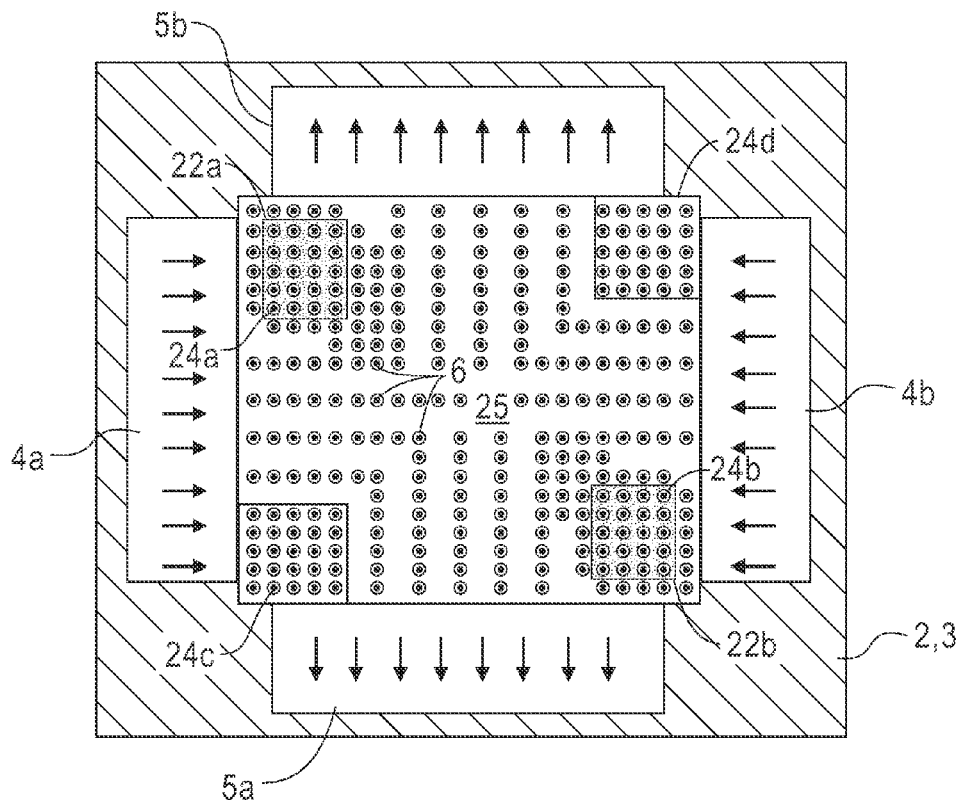

FIG. 14 shows a further embodiment of a cooling layer 3 arranged on a circuit layer 2 having two hot spots 22a and 22b. The embodiment shown in FIG. 14 combines several features of the embodiments described above. In particular, the hot spots 22a and 22b of the circuit layer 2 are arranged in corners 24a and 24b of the cooling layer 3 set up in a four-port configuration. In addition, electrical connections 6 connecting the circuit layer 2 with another circuit layer 2 arranged above or underneath it are arranged in a non-uniform way in order to guide a flow 13 of the cooling fluid 10 and generate a non-uniform flow pattern in the cooling layer 3.

In particular, the central area 25 will be cooled more or less equally despite the twofold symmetrical four-port configuration which was already described with reference to FIG. 12. This is achieved in part by providing a higher number of electrical connections 6 in the two corners 24c and 24d which are not occupied by hot spots 22. In this way, the flow resistance for the cooling fluid 10 is increased in areas corresponding to the corners 24c and 24d, while the flow resistance for the cooling fluid 10 in the central area 25 is reduced. In effect, a non-uniform flow pattern of the cooling fluid 10 is achieved, which is adapted to the heat dissipation of the circuit layer 2.

FIG. 18 shows an arrangement for a cooling layer 3 comprising four channel structures 27a to 27d. In a first area 11 corresponding to a hot spot 22 of a circuit layer 2 not shown in FIG. 18, the channel structures 27c and 27d comprise a narrowing structure, in which the walls of the channel structures 27c and 27d are narrowed significantly in order to increase the mass flow rate in the first area 11. In addition, all channel structures 27a to 27d are narrowed on their way from the fluid inlet 4 on the left-hand side to their respective fluid outlets 5 on the right-hand side in order to take account of the heating-up of the cooling fluid 10.

FIGS. 19A and 19B show further embodiments of an integrated circuit stack comprising a circuit layer 2 and a cooling layer 3 placed on top of it. Within the cooling layer 3, electrical connections 6 are arranged forming a grid structure.

The density of the grid structure is modulated in FIG. 19A by arranging more electrical connections 6 in a first area 11 corresponding to a hot spot 22. Conversely, fewer electrical connections are arranged in a second area 12 of the circuit layer 2.

In FIG. 19B the grid of electrical connections 6 forms a regular structure, i.e. it has a fixed pitch width. However, in order to decrease the convective thermal resistance in a first area 11 of a hot spot 22 of the circuit layer 2, the diameter of the individual pins forming the electrical connection 6 is increased there. Conversely, the diameter of the pins in the second area 12 is reduced in order to reduce the flow resistance.

Figure 20:
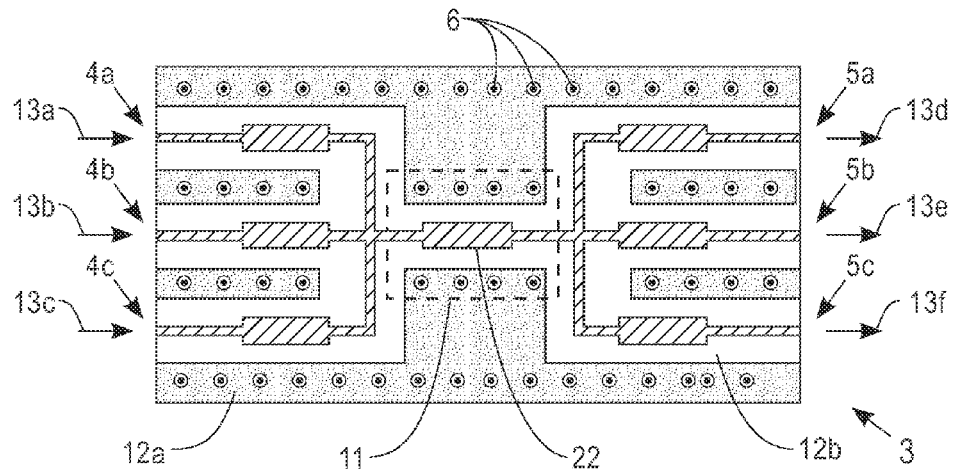

FIG. 20 shows another arrangement for a cooling layer 3 for focussing a flow of cooling fluid 10 in a first area 11 corresponding to a hot spot 22. In particular, flows 13a to 13c of cooling fluids fed into the cooling layer by means of three fluid inlets 4a to 4c are combined in the first area, before being split up into three individual flows 13d to 13f on the right-hand side of FIG. 20. As a consequence, second areas 12a and 12b on the left-hand and the right-hand side respectively are cooled less efficiently than the first area 11 arranged in the center.

Figures 21A, 21B:
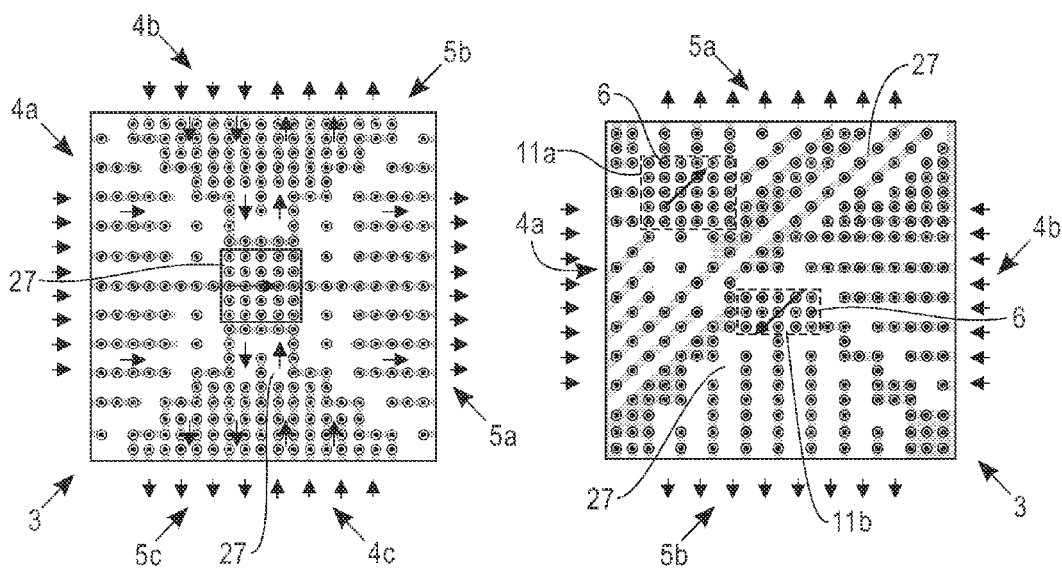

FIGS. 21A and 21B show further embodiments of cooling layers 3 in a so-called multi-port arrangement. In particular, FIG. 21A has three fluid inlets 4a to 4c and three fluid outlets 5a to 5c from all four sides of the cooling layer 3. Together with multiple channel structures 27, the cooling performance of the cooling layer 2 is adapted to the heat dissipation of a circuit layer 3 not shown in FIG. 21A.

FIG. 21B shows another cooling layer 3 in a four-port configuration, having two fluid inlets 4a and 4b and two fluid outlets 5a and 5b. Two first areas 11a and 11b, which are connected by means of several electrical connections 6 through the cooling layer 3 are cooled efficiently due to the arrangement of the fluid inlets 4, the fluid outlets 5 and several channel structures 27 of the cooling layer 3.

Figure 17:
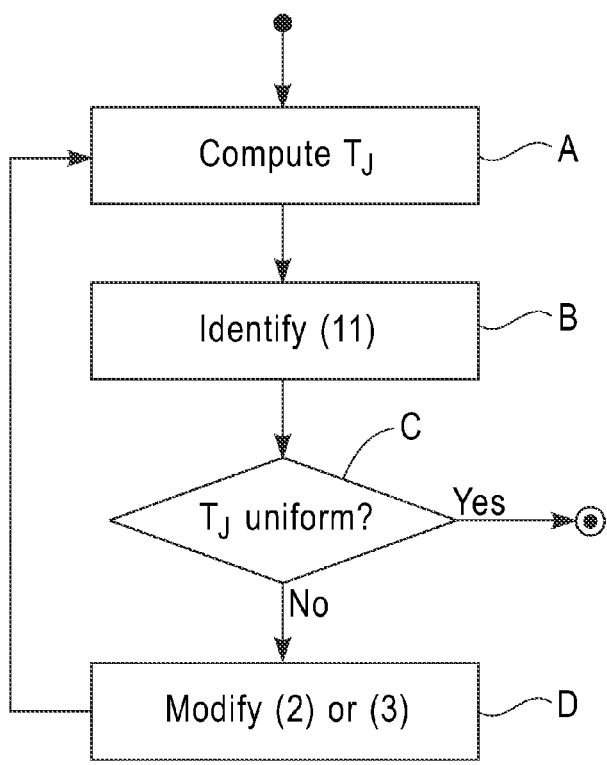

FIG. 17 shows a flow chart of a method for optimization an integrated circuit stack 1 in accordance with an embodiment of the invention. The method described here may be used during the design stage of the circuit layer 2 or the cooling layer 3, or both.

In a step A, the junction temperature $T_J$ of at least one circuit layer 2 is computed. Computation may be based on a known power map of the circuit layer 2 or its constituting parts. Alternatively, the junction temperature $T_J$ may be obtained by measurements performed at a prototype of the circuit layer 2.

If the power map of the circuit layer 2 is known, its junction temperature $T_J$ may be computed in a successive fashion, starting from a point with known boundary conditions, such as the temperature at the fluid inlet 4 and, subsequently computing the junction temperature $T_J$ of adjoining areas, until the junction temperature $T_J$ of the entire surface of the circuit layer 2 is known.

In a step B, one or more first area 11 may be identified. In one embodiment, at first an average junction temperature $T_J$ may be computed. Then, the junction temperature $T_J$ of different areas is compared with the average temperature or a given maximal junction temperature $T_{max}$. If, for example, one or more areas having an above average temperature or one or more areas having a below average temperature are identified, these are marked as first areas 11 and second areas 12, respectively.

In a step C, a test is performed, testing whether the junction temperature $T_J$ is sufficiently uniform. If this is the case, the optimization will end. For example the junction temperature $T_J$ to may be constant over the entire surface of the circuit layer 2, i.e. the circuit stack 1 is in its optimal configuration with respect to efficient cooling. Alternatively, the optimization procedure may end, once the junction temperature $T_J$ of the hottest first area 11 identified in step B lies below a maximal junction temperature $T_{max}$, or once a predetermined number of optimization steps have been performed. The process may also end, if no further equalization was achieved in a previous modification of the integrated circuit stack design.

Otherwise, i.e. if the junction temperature $T_J$ is not sufficiently uniform, the method proceeds in step D, by modifying a surface of either the cooling layer 3 or the circuit layer 2 in an attempt to improve the cooling performance of the circuit stack 1. In particular, means are employed in order to increase a mass flow rate in the first area 11 or to decrease the mass flow rate in the second area 12, or both. Such means may be chosen freely from those disclosed above or otherwise known to a person skilled in the art of circuit or cooling layer design.

In particular, one or several of the following methods may be employed:
1. Circuit components associated with the first area 11 may be moved closer to one or several fluid inlets 4.
2. Additional fluid inlets 4 or fluid outlets 5 may be provided.
3. A gap width of a hollow space 20 may be reduced in the first area 11 or enlarged in a second area 12.
4. A density of a grid may be reduced in the first area 11 or increased in the second area 12, e.g. by relocating electrical inter-circuit layer connections 6.
5. Guide elements 19 directing at least part of a flow 13 toward the first area 11 may be provided or enlarged
6. A channel 14 supplying or draining the first area 11 with an increased flow 13 of the cooling fluid 10 may be provided.

Subsequently, the method may be repeated starting at step A with computing an updated junction temperature $T_J$.

Although the various features for creating a non-uniform flow pattern have been described with reference to different embodiments above, it will be obvious to a person skilled in the art, that any of these features may be arranged and combined in many other configurations in order to improve the cooling efficiency of an integrated circuit stack 1.

The invention claimed is:

1. An integrated circuit stack, comprising a plurality of integrated circuit layers comprising at least a first circuit layer electrically connected to a second circuit layer, the first circuit layer having at least one first area of higher heat generation and at least one second area of lower heat generation, and at least one cooling layer arranged in a space between the first and the second circuit layer, the cooling layer comprising at least one fluid inlet and at least one fluid outlet and a hollow space hydraulically connecting the fluid inlet and the fluid outlet for cooling at least the first circuit layer using a cooling fluid, wherein the at least one cooling layer comprises a means for creating a non-uniform flow pattern for the cooling fluid in the hollow space resulting in a higher heat transfer in the first area than in the second area of the first circuit layer.

2. The integrated circuit stack according to claim 1, wherein the at least one cooling layer comprises at least one guide element directing at least part of the cooling fluid towards the first area.

3. The integrated circuit stack according to claim 2, wherein the at least one guide element is adapted for creating at least a first flow passing the first area having a higher mass flow rate than a second flow passing the second area.

4. The integrated circuit stack according to claim 2, wherein the at least one guide element comprises a funnel structure having a first opening towards the fluid inlet and a second opening towards the first area, the first opening being larger than the second opening.

5. The integrated circuit stack according to claim 1, wherein the at least one cooling layer comprises a channel structure having a first width in the first area and a second width in the second area, the first width being smaller than the second width.

6. The integrated circuit stack according to claim 5, wherein the width of the channel structure is reduced along at least one path from the fluid inlet to the fluid outlet.

7. The integrated circuit stack according to claim 1, wherein the at least one cooling layer comprises a grid structure having a lower density in the first area than in the second area.

8. The integrated circuit stack according to claim 1, wherein the at least one cooling layer comprises a grid structure having grid elements, at least one first grid element arranged in the first area having a larger cross-section than a second grid-element arranged in the second area.

9. The integrated circuit stack according to claim 7, wherein the grid structure comprises electrical connections between the first and second circuit layer.

10. The integrated circuit stack according to claim 1, wherein the at least one cooling layer comprises a first surface at the first circuit layer and a second surface at the second circuit layer, the first and second surface having a smaller distance between each other in the first area than in the second area.

11. The integrated circuit stack according to claim 10, wherein the distance between the first and the second surface is reduced along at least one path from the fluid inlet to the fluid outlet.

12. The integrated circuit stack according to claim 1, wherein the fluid inlet is placed closer to the first area than to the second area.

13. The integrated circuit stack according to claim 1, wherein the fluid outlet is placed closer to the second area than to the first area.

14. The integrated circuit stack according to claim 1, wherein the fluid inlet and the fluid outlet are arranged in proximity to a common corner of the cooling layer and the first area is arranged closer to the common corner than the second area.

15. The integrated circuit stack according to claim 1, wherein the cooling layer comprises at least two fluid inlets or at least two fluid outlets such that a first flow from the first inlet to the first outlet passing the first area is shorter than a second flow from the second fluid inlet to the first fluid outlet or from the first fluid inlet to the second fluid outlet, respectively.

16. The integrated circuit stack according to claim 1, wherein the cooling layer has a rectangular shape having four sides, a first and a third side being parallel to each other and a second and a fourth side being parallel to each other, the first and the third side being orthogonal to the second and the fourth side, the cooling layer comprising two fluid inlets and two fluid outlets arranged on the four sides.

17. The integrated circuit stack according to claim 16, wherein two fluid inlets are arranged on the first and the third side and two fluid outlets are arranged on the second and the fourth side.

18. The integrated circuit stack according to claim 16, wherein two fluid inlets are arranged on the first and the second side and two fluid outlets are arranged on the third and the fourth side.

19. The integrated circuit stack according to claim 1, comprising at least a first and a second cooling layers arranged above and below at least one common circuit layer, wherein a flow of the cooling fluid in the first cooling layer is directed in a first direction and a flow of the cooling fluid in the second cooling layer is directed in a second direction, being different from the first direction.

20. The integrated circuit stack according to claim 19, comprising at least a plurality of cooling layers, wherein a flow of the cooling fluid in alternating cooling layers is directed in opposite directions.

* * * * *